(12) United States Patent
Kim

(10) Patent No.: US 7,903,530 B2
(45) Date of Patent: Mar. 8, 2011

(54) OPTICAL SYSTEM FOR SPATIALLY CONTROLLING LIGHT POLARIZATION AND METHOD FOR MANUFACTURING THE SAME

(75) Inventor: Ho-Chul Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1584 days.

(21) Appl. No.: 11/194,458

(22) Filed: Aug. 2, 2005

(65) Prior Publication Data

US 2006/0028957 A1 Feb. 9, 2006

(30) Foreign Application Priority Data

Aug. 3, 2004 (KR) ........................ 10-2004-0061229

(51) Int. Cl.
*G11B 7/00* (2006.01)
(52) U.S. Cl. .......... 369/112.19; 369/112.03; 369/112.07; 369/112.1; 369/112.12
(58) Field of Classification Search ............. 369/112.01, 369/112.03, 112.07, 112.12, 112.19, 110.01
See application file for complete search history.

(56) References Cited

U.S. PATENT DOCUMENTS

| | | | | |
|---|---|---|---|---|
| 5,085,496 | A | * | 2/1992 | Yoshida et al. ............... 359/569 |
| 5,559,583 | A | | 9/1996 | Tanabe |
| 5,748,599 | A | * | 5/1998 | Yamamoto et al. ....... 369/112.12 |
| 5,815,247 | A | | 9/1998 | Poschenrieder et al. |
| 6,055,086 | A | | 4/2000 | Soutar et al. |
| 6,084,673 | A | | 7/2000 | Van Den Brink et al. |
| 6,118,586 | A | * | 9/2000 | Tanabe et al. ................. 359/566 |
| 6,278,548 | B1 | * | 8/2001 | Shimano et al. .............. 359/565 |
| 6,388,730 | B1 | | 5/2002 | Lindquist |
| 6,424,436 | B1 | * | 7/2002 | Yamanaka ....................... 359/15 |
| 6,552,317 | B1 | * | 4/2003 | Takeda et al. .............. 250/201.5 |
| 6,570,681 | B1 | | 5/2003 | Favalora et al. |
| 6,618,343 | B1 | * | 9/2003 | Saitoh et al. ............. 369/112.01 |
| 6,762,823 | B2 | | 7/2004 | Suzuki |
| 7,009,686 | B2 | | 3/2006 | Kawashima et al. |
| 7,110,180 | B2 | * | 9/2006 | Kawasaki et al. ............. 359/569 |
| 2004/0012764 | A1 | | 1/2004 | Mulder et al. |
| 2006/0140070 | A1 | * | 6/2006 | Shiono et al. ............. 369/44.23 |

FOREIGN PATENT DOCUMENTS

| | | |
|---|---|---|
| DE | 696 09 848 T 2 | 3/2001 |
| DE | 697 09 584 | 6/2002 |
| JP | 11-024073 | 1/1999 |
| JP | 2000-112116 | 4/2000 |

(Continued)

OTHER PUBLICATIONS

Brunner, et al. "High NA lithographic imagery at Brewster's angle", Optical Microlithography XV, Proceedings of SPIE, vol. 4691, pp. 1-10, (Jul. 2002).

*Primary Examiner* — Wayne R Young
*Assistant Examiner* — Linh T Nguyen
(74) *Attorney, Agent, or Firm* — Lee & Morse, P.C.

(57) ABSTRACT

An optical system for spatially controlling light polarization, and method for manufacturing the same, includes a light source for generating a light beam of a designated wavelength, a beam shaper for splitting the light beam generated from the light source into a plurality of partial beams, and a polarization controller controlling the polarization states of the partial beams. The polarization controller may be formed on the beam shaper or separate from the beam shaper.

18 Claims, 13 Drawing Sheets

FOREIGN PATENT DOCUMENTS

| | | |
|---|---|---|
| JP | 2001-358057 | 12/2001 |
| JP | 2004-111678 | 4/2004 |
| KR | 1998-0028354 | 7/1998 |
| KR | 1998-056936 U | 10/1998 |
| KR | 2003-0067944 | 8/2003 |
| KR | 10-2004-0006498 A | 1/2004 |
| TW | 556 009 | 10/2003 |
| TW | 573 193 | 1/2004 |

* cited by examiner

OPTICAL SYSTEM FOR SPATIALLY CONTROLLING LIGHT POLARIZATION AND METHOD FOR MANUFACTURING THE SAME

BACKGROUND OF THE INVENTION

1. Field of the Invention

The present invention relates in general to an optical system and method for manufacturing the same. More specifically, the present invention relates to an optical system for spatially controlling light polarization and method for manufacturing the same.

2. Description of Related Art

To keep pace with rapid technical advances in semiconductor integration, there is a need to increase the resolution of an optical system used to manufacture semiconductor devices. Rayleigh's equation in the following Equation 1 introduces a fundamental strategy to enhance resolution ($W_{min}$) of the optical system.

$$W_{min} = k_1 \lambda / NA \tag{1}$$

Thus, to get a high resolution, the wavelength λ of light and process factor $k_1$ should be decreased, and the numerical aperture NA of the system should be increased. As can be seen in FIG. 1, after much effort, the wavelength of light used in an exposure device has been decreased considerably from a G-line of a mercury arc lamp (436 nm) in 1982 to an argon fluoride (ArF) laser wavelength (193 nm) of today. Recent research shows that the wavelength is going to need to be as low as a fluoride dimmer (F2) laser wavelength (157 nm) in the near future. Moreover, since the exposure process has been supported by improved photomasks and lenses, better photoresists and process controls, and more powerful resolution enhancement techniques (RET), the process factor $k_1$ has been decreased from above 0.85 in 1982 to below 0.45 today, with continuing improvement expected in the near future, as shown in FIG. 2.

Meanwhile, the graph in FIG. 1 shows a steady increase in the NA, for example 0.3 for G-line in 1982, 0.6 for a krypton fluoride (KrF) laser (248 nm) in 1998, and 0.7 for an ArF laser (193 nm) in 2002. The increase in the NA is expected to be continuous until an extreme ultra violet (EUV) laser (13.5 nm) is available. As long as an immersion technique in conjunction with current wavelengths of 193 nm or even 157 nm provides sufficient resolution, these wavelengths are expected to continue to be used in semiconductor exposure devices. However, recent inquires have predicted a fundamental loss of transverse magnetic (TM) image contrast caused by a large NA.

The graphs in FIG. 3A and FIG. 3B respectively illustrate a relationship between NAs and image contrast of transverse electric (TE) and TM polarization, as discussed in the article by Timothy A. Brunner, et al., "High-NA lithographic imagery at Brewster's angle," *Proceedings of SPIE*, Vol. 4691, Optical Microlithography XV, (July 2002), pp. 11-24. More specifically, FIG. 3A illustrates how image contrast changes with respect to the interference between two coherent beams when the two beams are positioned respectively at the center and the edge of the pupil defining the NA. FIG. 3B illustrates how image contrast changes with respect to the interference between two coherent beams when the two beams are positioned respectively at opposite edges of the pupil defining the NA.

Referring to FIGS. 3A and 3B, the image contrast of a TE polarized light is 1 for every NA, but the image contrast of a TM polarized light decreases as the NA increases. The decrease in the image contrast of TM polarized light is more evident when two beams are arranged at opposite edges of the pupil, as for a powerful RET, e.g., alternating phase-shift masks (PSM). For example, as shown in FIG. 3B, when the NA is 0.71, the image contrast of the TM polarized light decreases to 0, and when the NA is 1, the image contrast of the TM polarized light decreases to -1. When the image contrast of the TM polarized light becomes -1, the TM polarized light and the TE polarized light are offset. Since the TM polarized light does not contribute significantly to the exposure of the photoresist, there is a need to develop an optical system capable of selectively using the TE polarized light in the exposure process using a large NA.

However, as shown in FIG. 4, when a photomask has master patterns 1 with different directions, light polarized in one direction can be absorbed by the photomask. In such case, the intensity of the polarized light reaching the surface of the semiconductor substrate might not be strong enough to expose the photoresist. Therefore, to utilize polarized light for the exposure process, it is necessary to control the polarization state of the light according to its position.

In summary, while an exposure system with a larger NA is required to manufacture highly integrated semiconductor devices, it is also important that the exposure system be able to control the state of polarization of a light beam, especially when the NA exceeds a designated size. However, considering that a variety of different directional patterns are to be formed in the exposure process, an optical system for spatially controlling light polarization is required.

SUMMARY OF THE INVENTION

The present invention is therefore directed to an optical system and method for manufacturing the same, which substantially overcomes one or more of the problems due to the limitations and disadvantages of the related art.

It is therefore a feature of an embodiment of the present invention to provide an optical system using only TE polarized light.

It is another feature of an embodiment of the present invention to provide an optical system for spatially controlling light polarization.

It is yet another feature of an embodiment of the present invention to provide a manufacturing method of an optical system for spatially controlling light polarization.

At least one of the above and other features and advantages of the present invention may be realized by providing an optical system including a light source for generating a light beam of a designated wavelength, a target object on which the light beam generated from the light source is irradiated, a beam shaper in an optical path between the light source and the target object, the beam shaper splitting the light beam into a plurality of partial beams, and a polarization controller in the optical path between the light source and the target object, the polarization controller controlling the polarization states of the plurality of partial beams.

The beam shaper may include a natural number n of partial areas. Each of the partial areas of the beam shaping element may include a natural number m of subordinate areas, the subordinate areas having different thicknesses in accordance with their position in the beam shaper to split the light beam into the plurality of partial beams. Each of the subordinate areas has one of a first thickness and a second thickness greater than the first thickness.

The polarization controller may include n×m subordinate polarization patterns, polarization patterns in j'th subordinate area of i'th partial area ($1 \leq i \leq n$) and j'th subordinate area of k'th partial area (k≠i and 1≦k≦n) outputting a same polarization state. The polarization patterns in j'th subordinate area of i'th partial area (1≦i≦n) and j'th subordinate area of k'th partial area (k≠i and 1≦k≦n) may be bar patterns in the same direction.

The beam shaper may be a diffractive optical element (DOE) or a holographic optical element (HOE).

The polarization controller may include a plurality of bar patterns arranged in a designated direction. A pitch between the plurality of bar patterns may be about 0.2 to 1.5 times the wavelength of the light beam, and a width of each bar pattern may be about 0.2 to 0.8 times the pitch between the bar patterns. Each of the bar patterns may be about 10 nm to 200 nm in thickness. The bar patterns may be made of materials having a real refractive index between about 1.3 and 2.5, and an extinction coefficient between about 0 and 0.2. The material for the bar patterns may be selected from a group including SiN, SiON and photoresist.

The optical system may further include a light delivery system for delivering the light beam generated from the light source to the target object. The target object may be a photomask having designated circuit patterns for the manufacture of a semiconductor device formed thereon.

The polarization controller may be on the surface of the beam shaper. The beam shaper and the polarization controller may be separate elements. The beam shaper may be disposed between the light source and the polarizer or between the polarizer and the target object.

At least one of the above and other feature and advantages of the present invention may be realized by providing a method for forming an optical system, including creating a beam shaper for splitting a light beam of a designated wavelength source into at least one partial beam and creating a polarizer for controlling the polarization states of the at least one partial beam.

Creating the beam shaper may include preparing a transparent substrate having a natural number n of partial areas, in which each of the partial areas may include a natural number m of subordinate areas, and patterning the substrate to different thicknesses of the subordinate areas according to positions, thereby forming diffractive optical patterns for outputting the light beam with a designated profile. Creating the polarizer may include forming polarization patterns providing the same polarization state in the same subordinate areas of each of the partial areas of the beam shaper. Creating the polarizer may include forming polarization patterns in a designated direction on a surface of the beam shaper. Creating the polarizer may include forming polarization patterns in a designated direction on a surface separate from the beam shaper.

At least one of the above and other feature and advantages of the present invention may be realized by providing a method for manufacturing a semiconductor device, including generating a light beam of a designated wavelength, splitting the light beam into a plurality of partial beams having different polarization states from each other, and exposing a photoresist layer coated on a semiconductor substrate using the plurality of partial light beams having the different polarization states from each other.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
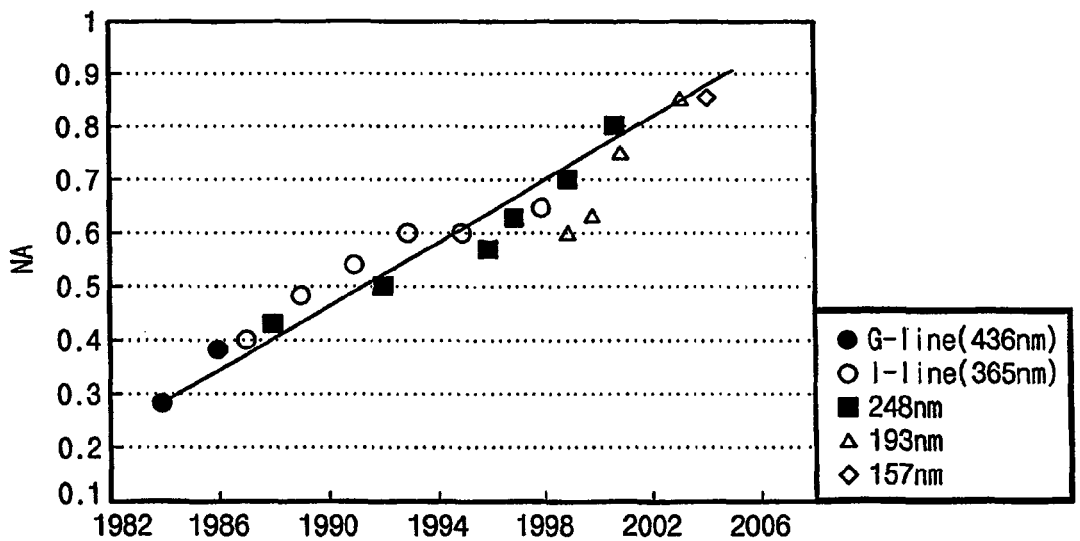
FIG. 1 and FIG. 2 are graphs showing semiconductor exposure technique developments.
Figure 2:
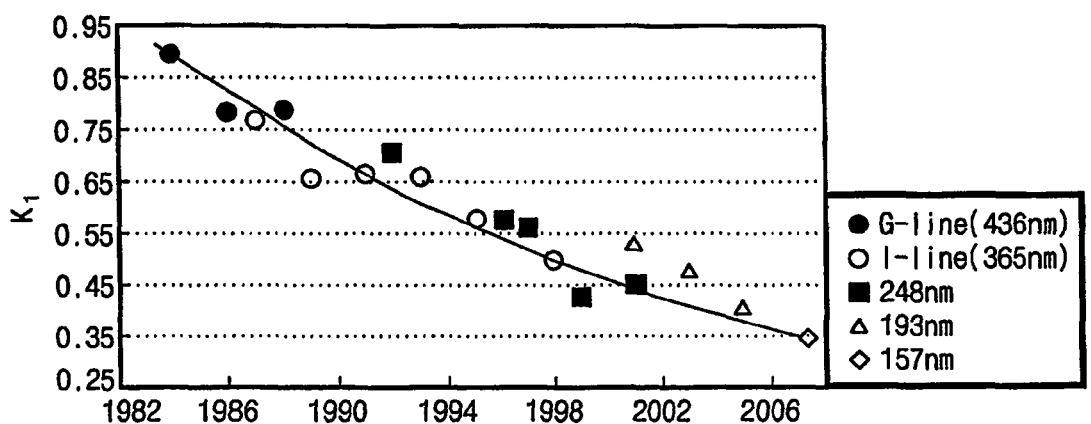
Figure 3A:
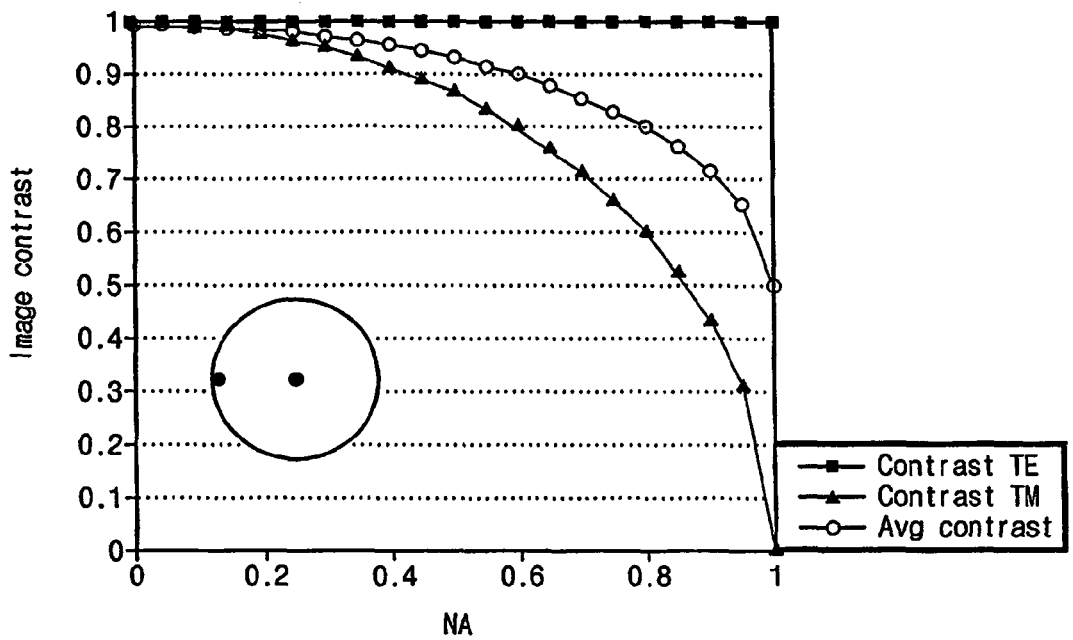
FIG. 3A and FIG. 3B are graphs showing a relationship between NAs and image contrast of polarized lights.
Figure 3B:
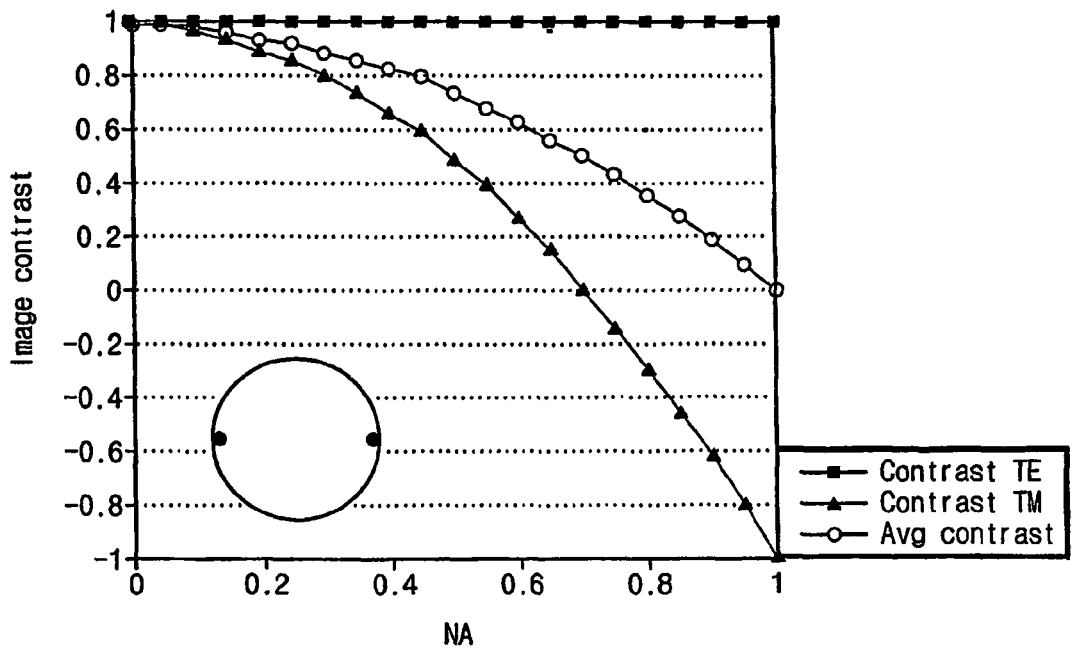
Figure 4:
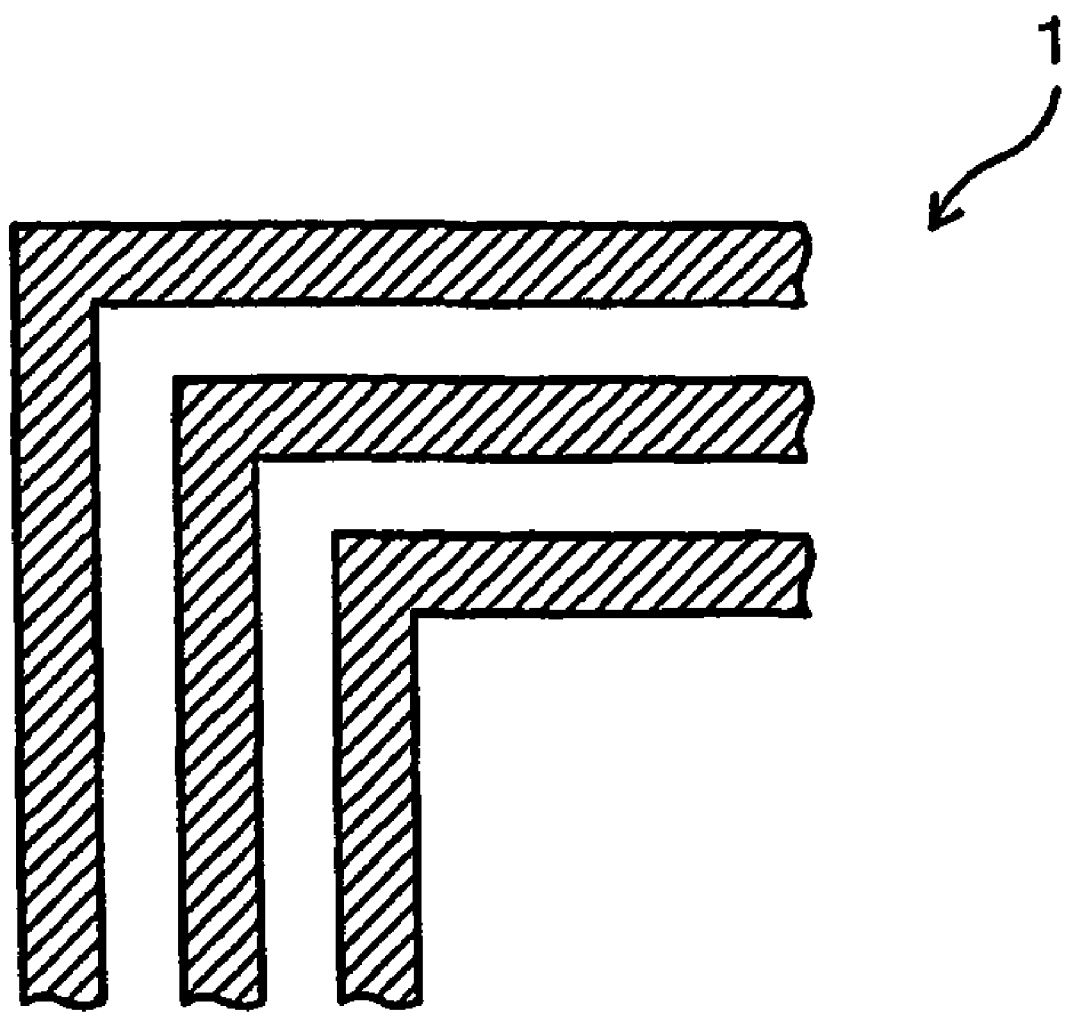
FIG. 4 illustrates a plan view of a portion of different-directional patterns.

Korean Patent Application No. 2004-61229, filed on Aug. 3, 2004, in the Korean Intellectual Property Office, and entitled: "Optical System for Spatially Controlling Light Polarization and Method for Manufacturing the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

Figure 5:
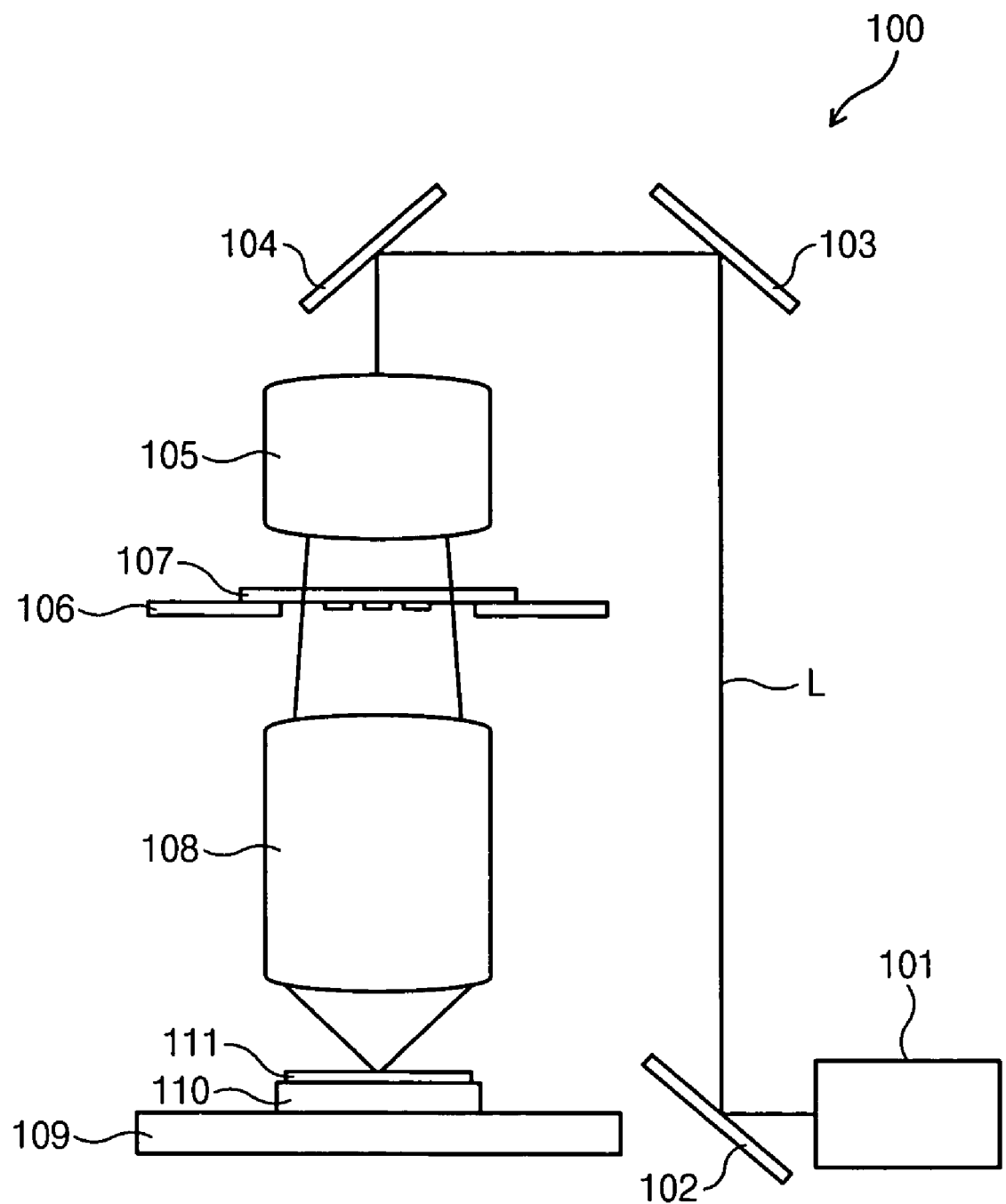
FIG. 5 illustrates a schematic view of an exposure device according to an embodiment of the present invention.

FIG. 5 is a schematic view of an exposure device according to an embodiment of the present invention.

Referring to FIG. 5, the exposure device 100 according to the present invention includes a light source 101 for generating a light beam L with a designated wavelength, and a light delivery system for delivering the light beam L generated from the light source 101 to an illumination system 105. As shown in FIG. 5, the light delivery system can include a plurality of mirrors 102, 103 and 104.

The illumination system 105 includes a beam shaper (or a beam shaping element) for changing (or splitting) the light beam L generated from the light source 101 into partial beams L' in diverse spatial profiles as depicted in FIG. 6A to FIG. 6G. The profiles shown in FIG. 6A to FIG. 6G are examples of typical spatial profiles used in manufacturing semiconductor devices. The beam shaper splits the light beam L from the light source 101 into a plurality of partial beams having different partial paths from each other. To this end, the beam shaper functions on the principle of diffraction. Examples of the beam shaper include a diffractive optical element (DOE) and a holographic optical element (HOE).

The exposure device 100 further includes a photomask 107 having master patterns drawn thereon, and a wafer stage 109 on which a semiconductor substrate 110 coated with a photoresist 111 is loaded. The photomask 107 is loaded on a designated mask stage 106, and a lens system 108 is disposed between the mask stage 106 and the wafer stage 109. If the immersion technique is used, the space between the lens system 108 and the photoresist 111 can be filled with designated liquid.

Figure 6A:
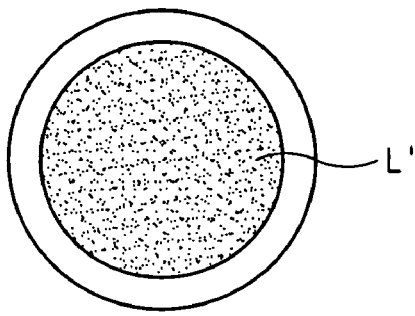
FIG. 6A to FIG. 6G illustrate light beams having different spatial profiles.
Figure 6B:
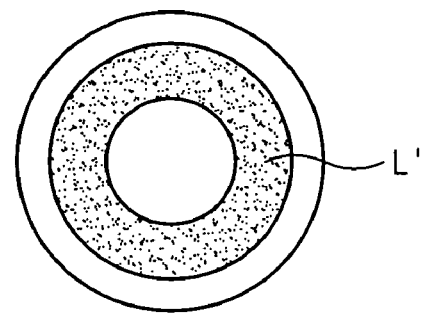
Figure 6C:
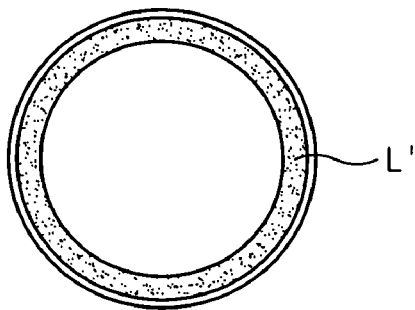
Figure 6D:
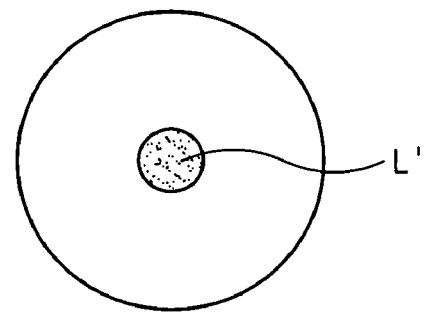
Figure 6E:
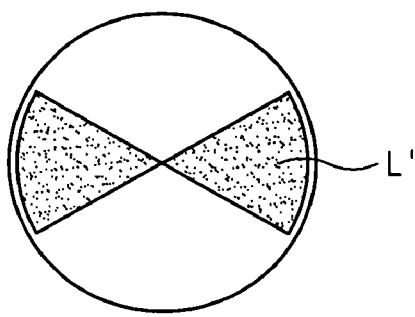
Figure 6F:
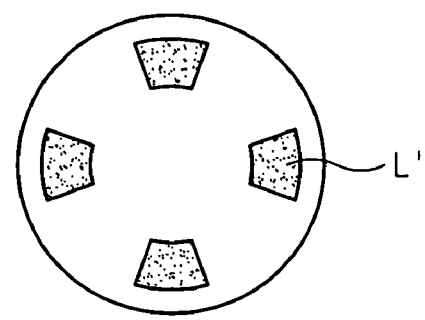
Figure 6G:
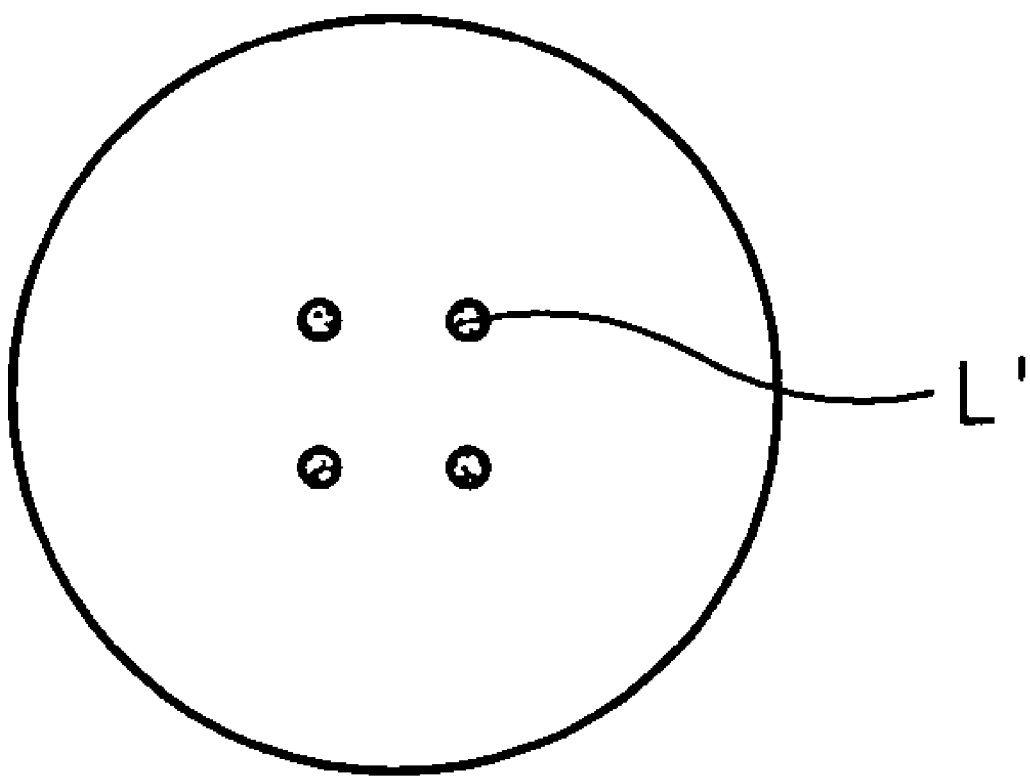
Figure 7A:
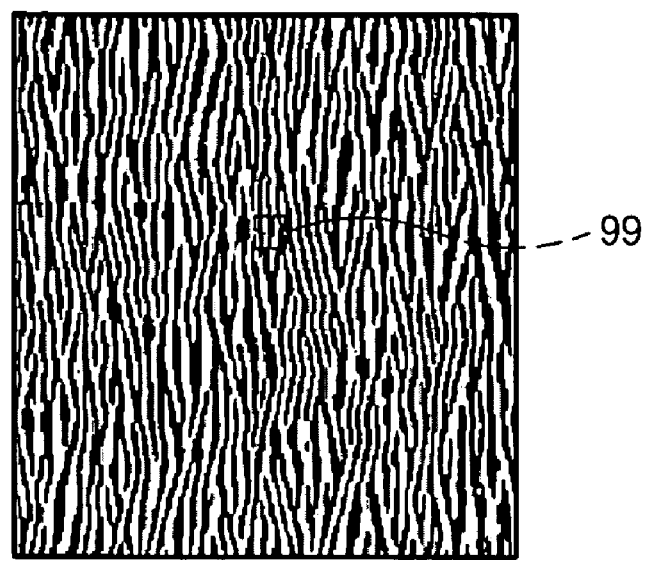
FIG. 7A is a plan view of a hologram that can be used as a beam shaping element.
Figure 7B:
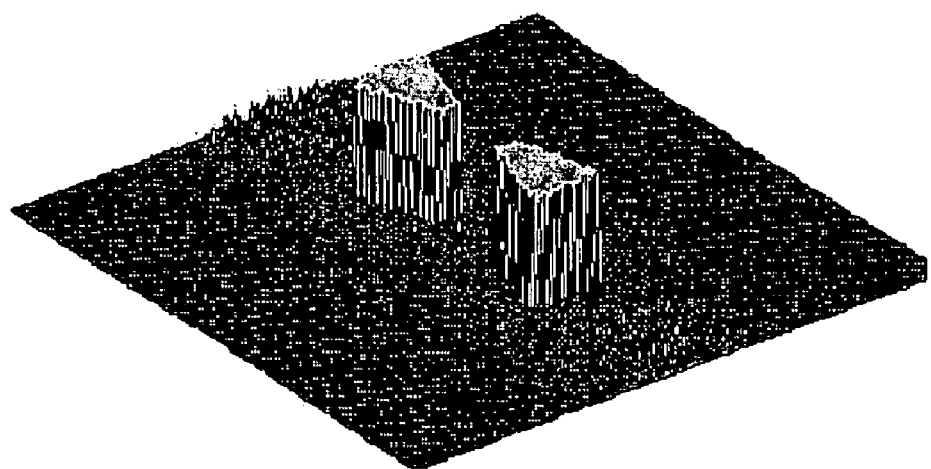
FIG. 7B illustrates a spatial intensity distribution of a light beam that is formed by using the hologram shown in FIG. 7A.
Figure 8A:
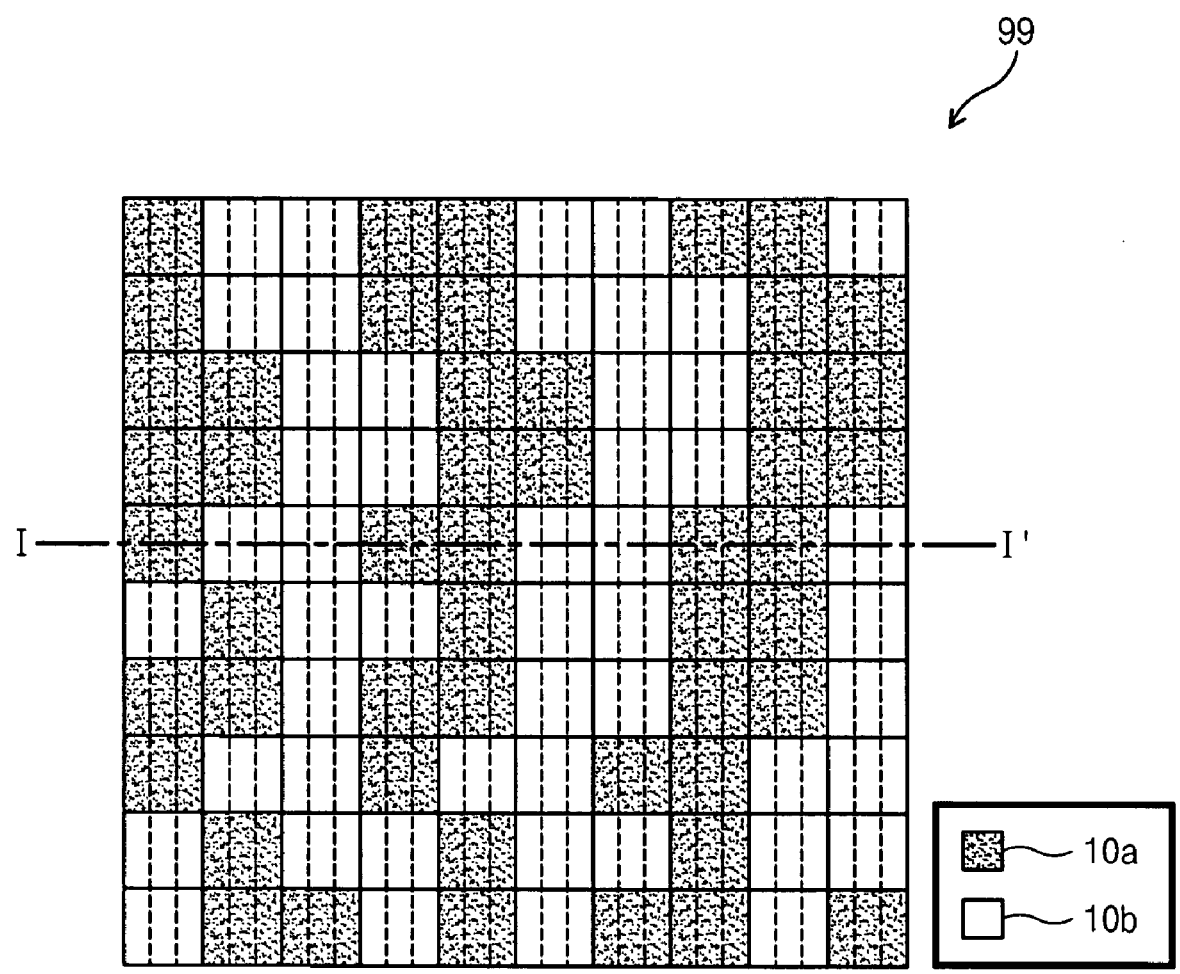
FIG. 8A to FIG. 8C illustrate schematic views of a polarization controller according to a first embodiment of the present invention.

FIG. 7A illustrates a plan view of a holographic pattern that can be discovered in the beam shaper, e.g., a HOE, according to the present invention. The specific holographic pattern of FIG. 7A is used to form partial beams L' in a dipole pattern, as shown in FIG. 6E and FIG. 7B. As can be seen in FIG. 8A, which is an enlarged view of an area 99 of FIG. 7A, the beam shaper can be divided into a plurality of partial areas. The holographic pattern in this case is obtained when the partial areas having different physical structures, e.g., thickness, are spatially distributed. In other words, the holographic pattern, as shown in FIGS. 8A and 8B, includes first partial areas 10a and second partial areas 10b with different thicknesses from each other.

The partial areas have different thicknesses according to their positions so that the partial beams L' can form any of the spatial profiles shown in FIGS. 6A to 6G. The thickness of each of the partial areas 10a, 10b is determined by calculating the optical properties of a light beam that passes through each partial area. The calculation generally involves the use of Fourier Transformation using a computer. The manufacture of the beam shaper further includes patterning a beam shaping substrate 200 using photolithography and etching processes after the thickness of each of the partial areas is calculated. The calculated thicknesses are then used in the patterning step to determine an etch depth at a particular location on the beam shaping substrate 200.

Figure 8B:
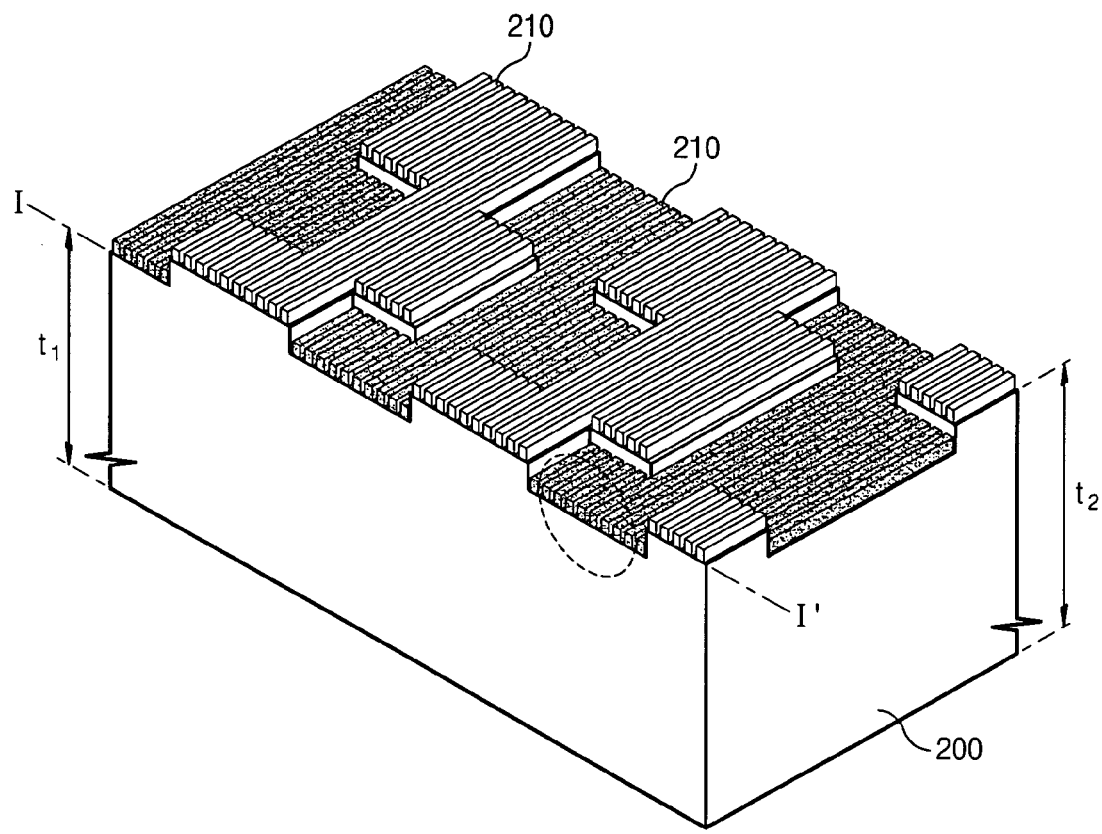

FIG. 8B illustrates a schematic perspective view taken along line I-I' of FIG. 8A. Referring to FIG. 8B, partial areas belong to the first partial area 10a have a first thickness $t_1$, and partial areas belonging to the second partial area 10b have a second thickness $t_2$. Alternatively, it is also possible to make the partial areas 10a, 10b have a wide range of thicknesses.

According to the first embodiment of the present invention, the beam shaper includes a polarization controller that changes or splits the light beam into at least one polarization-controlled partial beam. Accordingly, designated polarization patterns 210 are formed on the surface of the beam shaper. In this particular example, the polarization patterns 210 in a single direction are formed on the partial areas. As a result, all partial beams passing through the beam shaper have the same polarization.

Figure 8C:
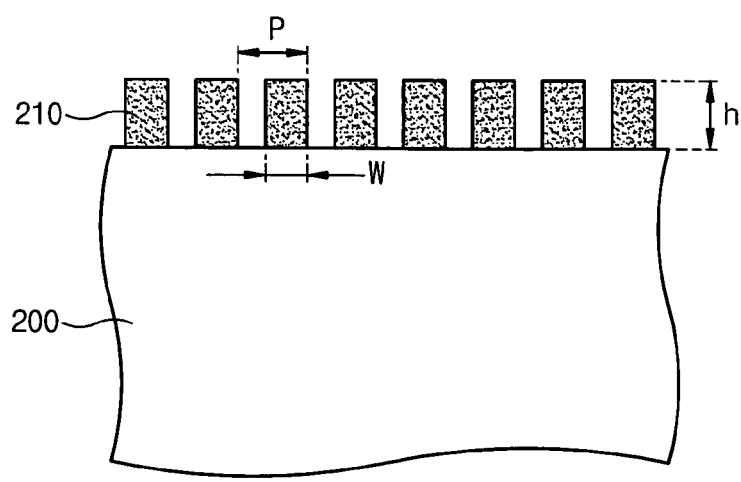

According to one embodiment of the present invention, the polarization patterns 210 can be bar patterns having a designated pitch P as shown in FIG. 8B and FIG. 8C. The pitch P between the bar patterns 210 may be between about 0.2 to 1.5 times the wavelength λ of the light beam, and the width W of each bar pattern may be about 0.2 to 0.8 times the pitch between bar patterns. Also, each bar pattern 210 may have a thickness h of about 10 nm to 200 nm. The bar patterns 210 may be made of materials having a real refractive index n between about 1.3 and 2.5 and an extinction coefficient k between about 0 and 0.2 (where the complex refractive index N=n−ik). Examples of the materials for the bar patterns 210 include photoresist, e.g., ArF photoresist, silicon nitride (SiN), e.g., LP—SiN, and silicon oxynitride (SiON).

Figure 9A:
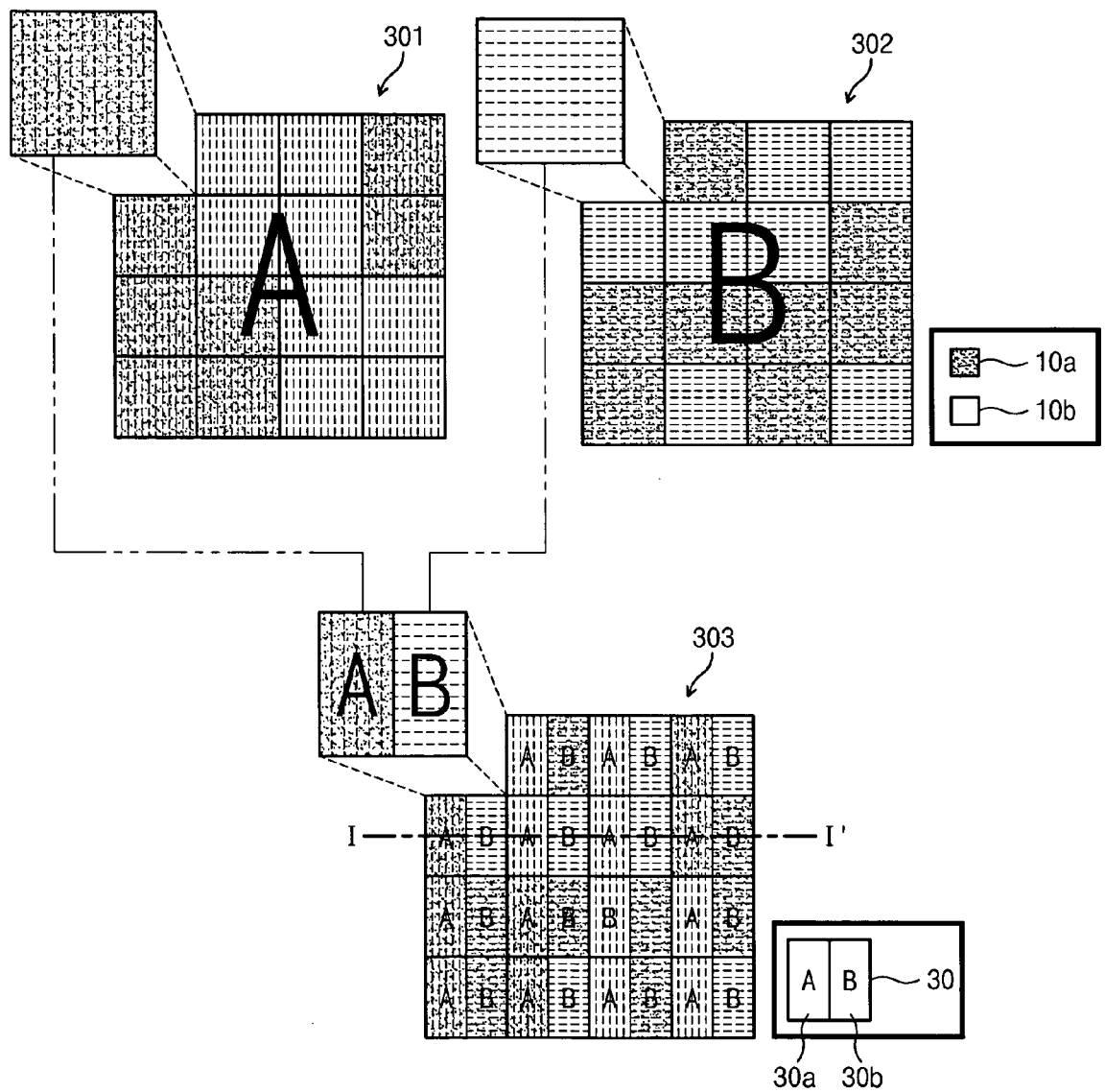
FIG. 9A and FIG. 9B illustrate schematic views of a polarization controller according to a second embodiment of the present invention.
Figure 9B:
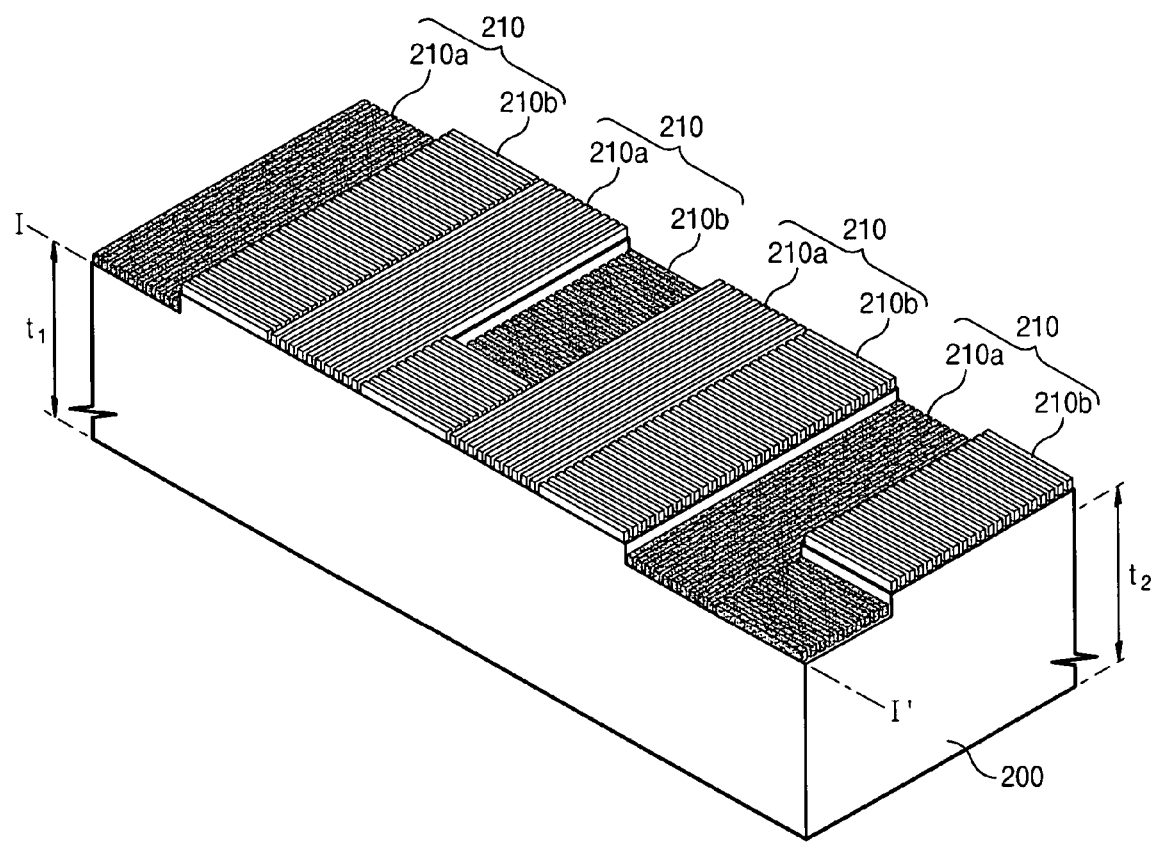

FIG. 9A illustrates a schematic plan view for the polarization controller 303 that forms partial beams that are polarized perpendicular to each other. FIG. 9B illustrates a schematic perspective view taken along line I-I' of FIG. 9A. To form perpendicularly polarized partial beams, the polarization controller 303, as depicted in FIG. 9A, is manufactured by combining a first virtual polarization controller 301, which forms a first polarization state in a first direction, and a second virtual polarization controller 302, which forms a second polarization state in a second direction perpendicular to the first direction. At this time, the manufacture of the first and second virtual polarization controllers 301, 302 are identical with that of the beam shaper described in FIG. 8A and FIG. 8B. However, the first and second virtual polarization controllers 301 and 302 are introduced simply to illustrate one method of manufacturing the polarization controller 303, i.e., there is no need to actually manufacture the virtual polarization controllers.

More specifically, the polarization controller 303 includes a plurality of partial areas 30, and the first and second virtual polarization controllers 301, 302, as described in FIG. 8B, include the first partial area 10a and the second partial area 10b having a greater thickness than the first partial area 10a. As shown in FIG. 9A, each partial area 30 of the polarization controller 303 is formed by combining partial areas located at corresponding positions on the first and second polarization controller 301, 302, respectively.

The thickness distributions on the first and second virtual polarization controllers 301, 302 determine profiles of the partial beams that pass through the polarization controllers, and the directions of polarized patterns formed on the first and second virtual polarization controllers 301, 302 determine the polarization states of the partial beams. Therefore, a light beam passing through each partial area 30 of the polarization controller 303 has physical properties of superposed partial beams (e.g., profile and polarization state of a light beam) which are individually made by using the first and second virtual polarization controllers 301, 302.

According to the second embodiment of the present invention, each partial area 30 of the polarization controller 303 includes a first subordinate area 30a and a second subordinate area 30b. A thickness of the first subordinate area 30a is the same as the thickness of the partial area at the corresponding position on the first virtual polarization controller 301. In like manner, a thickness of the second subordinate area 30b is the same as the thickness of the partial area at the corresponding position on the second virtual polarization controller 302. Profiles of the partial beams passing through the polarization controller 303 are the same as those of superposed partial beams that passed through the first and second virtual polarization controllers 301, 302, respectively.

In addition, the first subordinate area 30a and the second subordinate area 30b of FIG. 9A respectively include first polarization patterns 210a and second polarization patterns 210b, as shown in FIG. 9B, in the same directions as the polarization patterns that are formed on the partial areas at the corresponding positions of the first and second virtual polarization controller 301, 302. Accordingly, a partial beam that is formed after passing through the first subordinate area 30a has the same polarization state as that of a beam passing through the first virtual polarization controller 301. Similarly, a partial beam that is formed after passing through the second subordinate area 30b has the same polarization state as that of a beam passing through the second virtual polarization controller 302.

For an optimal combination, a number of partial areas on the polarization controller 303 is equal to that on the first and second virtual polarization controllers 301, 302. Also, the partial areas illustrated in the drawings are literally part of the polarization controllers 301, 302 and 303.

The polarization controller of the present invention can be generalized. This general structure can be used as a base unit for designing/manufacturing a polarization controller with more complicated applications. The polarization controller of the present invention includes a positive integer or natural number n of partial areas 30, and each of the partial areas 30 has a positive integer or natural number m of subordinate areas. Thus, the polarization controller has n×m subordinate areas.

Preferably, a total number of the subordinate areas is equal to the number of light beams required to form a desired beam profile. By varying thicknesses of the subordinate areas, a partial beam of a desired profile can be created. According to an embodiment of the present invention, thicknesses of the k'th ($1 \leq k \leq m$) subordinate areas in each partial area determine the profiles of the k'th partial beams.

Moreover, according to an embodiment of the present invention, the polarization patterns in the j'th subordinate area in the i'th ($1 \leq i \leq n$) partial area and the j'th subordinate area in the k'th ($k \neq i$ and $1 \leq k \leq n$) partial area have the same polarization properties. For instance, polarization patterns 210 in the same direction are arranged in these areas. In other words, the j'th partial beams determined by the j'th subordinate areas have the polarization properties that are determined by the polarization patterns 210 formed on the j'th subordinate areas. Preferably, as already explained referring to FIG. 8B and FIG. 8C, the polarization patterns 210 are bar patterns having a pitch P of between about 0.2 to 1.5 times the wavelength $\lambda$ of the light beam, and a width W of between about 0.2 to 0.8 times the pitch between bar patterns. Also, each bar pattern 210 may have a thickness h of about 10 nm to 200 nm. Preferably, the bar patterns 210 are made of materials having a refractive index n between about 1.3 and 2.5 and an extinction index k between about 0 and 0.2. Examples of the materials for the bar patterns 210 include ArF photoresist, SiN and SiON.

Figure 10:
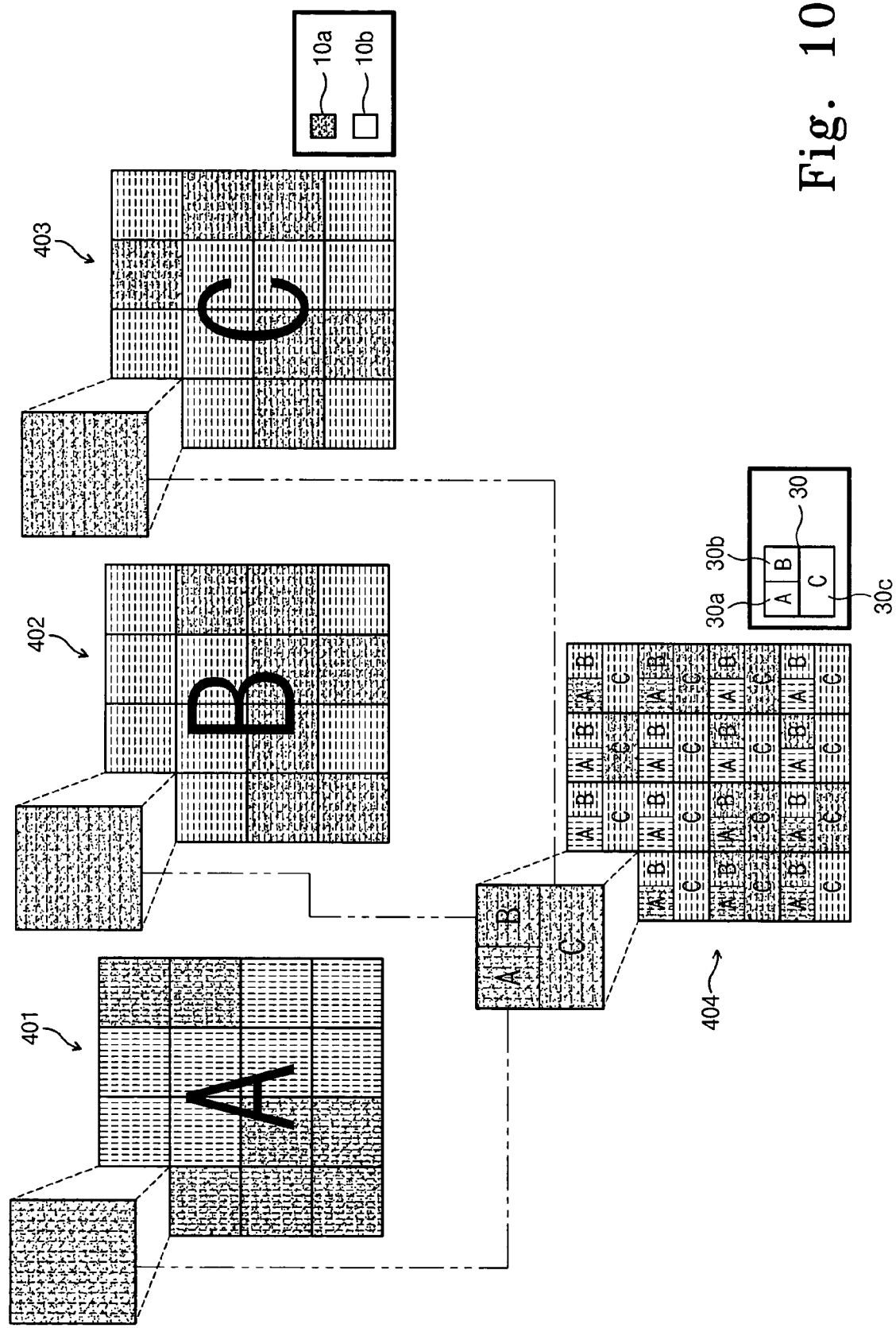
FIG. 10 illustrates a schematic plan view of a polarization controller according to a third embodiment of the present invention.

FIG. 10 illustrates a third embodiment of the present invention including a first, a second and a third polarization controller 401, 402, and 403 in order to make three different partial beams. As shown in the drawing, the area of the third subordinate area (C) is approximately twice the area of each of the individual first and second subordinate areas (A, B). In this case, the intensity of the partial beams formed by the third subordinate areas (C) is twice the intensity of the partial beams formed by the individual first and second subordinate areas (A, B). In other words, the intensity of the j'th partial beam is determined by the areas of the j'th subordinate areas.

Figure 11:
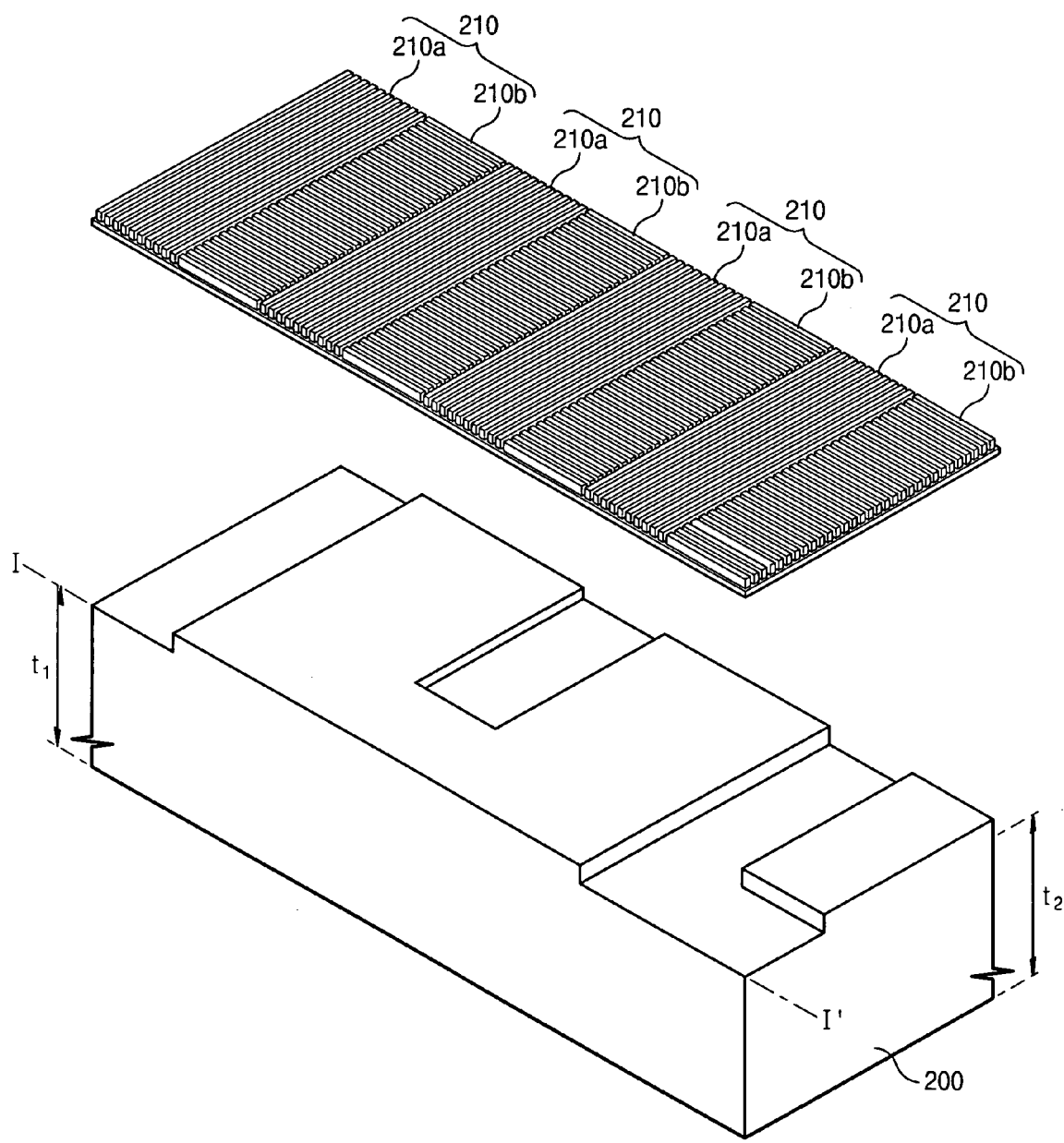
FIG. 11 illustrates a schematic perspective view of a polarization controller according to a fourth embodiment of the present invention.

According to another embodiment of the present invention, the technical objects and features of the present invention can also be achieved through an optical system in which a beam shaper and a polarizer are separate. This embodiment is similar to the previously described embodiments, so details of the same technical features will not be provided here. As shown in FIG. 11, the optical system according to the fourth embodiment includes a beam shaper on the beam shaper substrate 200 for changing or splitting the light beam into partial beams and a polarizer 210, disposed at a distance from the beam shaper substrate 200, for controlling the polarization states of the partial beams. The polarizer 210 can be disposed above the beam shaper, i.e., between the light source 101 and the beam shaper, or below the beam shaper, i.e., between the beam shaper and the photomask 107.

As in the above-described embodiments, the beam shaper includes a natural number n of partial areas, and each of the partial areas 30 includes a natural number m of subordinate areas. Moreover, the polarizer includes a plurality of subordinate polarization plates, and the subordinate polarization plates on the traveling path of the partial beams having passed through the j'th subordinate area in the i'th ($1 \leq i \leq n$) partial area and the j'th subordinate area in the k'th ($k \neq i$ and $1 \leq k \leq n$) partial area have a physical structure providing the same polarization properties. Accordingly, there are at least n×m subordinate polarization plates.

To make the optical system with the above structure, a light source is first placed, and then the beam shaper and the polarizer are disposed between the light source and the photomask. The light source outputs a light beam having a designated wavelength. The beam shaper is an optical element that splits the light beam generated from the light source into at least one partial beam. As mentioned before, a diffractive optical element (DOE) or a holographic optical element (HOE) may be used as the beam shaper. The polarizer polarizes the partial beams.

To manufacture the beam shaper, a transparent substrate is first prepared, and a patterning process is then performed on the substrate. The substrate includes a natural number n of partial areas, and each partial area includes a natural number m of subordinate areas. The patterning process includes forming subordinate areas of different thicknesses according to their positions. By arranging the subordinate areas of different thicknesses at different positions, the diffractive optical patterns are created and these patterns change an incident light beam into a designated profile.

To form the polarizer, polarization patterns in a designated direction may be created on the surface of the beam shaper. The same subordinate areas of each of the partial areas in the beam shaper have the same polarization patterns formed thereon, thus providing the same polarization state. Alternatively, the polarizer can be formed on a separate substrate that is disposed at a distance from the surface of the beam shaper. The structure and arrangement of the polarization patterns are analogous to those in FIG. 8B, FIG. 9B, FIG. 10, and FIG. 11, so they will not be explained in detail here.

According to an embodiment of the present invention, polarization patterns in a designated direction are arrayed in the subordinate areas of the beam shaper. In this manner, a light beam can have both a controlled polarization state and a controlled profile. In other words, the optical system of the present invention is capable of spatially controlling the polarization state of the light beam. Therefore, a decrease in contrast that usually occurs to an exposure device having a large NA can be prevented.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An optical system, comprising:
   a light source for generating a light beam of a designated wavelength;
   a target object on which the light beam generated from the light source is irradiated, the target object being a photomask having designated circuit patterns for the manufacture of a semiconductor device;
   a beam shaper in an optical path between the light source and the target object, the beam shaper splitting the light beam into a plurality of partial beams; and
   a polarization controller in the optical path between the light source and the target object, the polarization controller controlling the polarization states of the plurality of partial beams, wherein:

the beam shaper includes a natural number n of partial areas, and each of the partial areas of the beam shaper includes a natural number m of subordinate areas, the subordinate areas having different thicknesses in accordance with their position in the beam shaper to split the light beam into the plurality of partial beams; and the polarization controller includes a plurality of bar patterns arranged in a designated direction, a pitch between the plurality of bar patterns is about 0.2 to 1.5 times the wavelength of the light beam, and a width of each bar pattern is about 0.2 to 0.8 times the pitch between the bar patterns.

2. The optical system as claimed in claim 1, wherein the polarization controller comprises n×m subordinate polarization patterns, polarization patterns in j'th subordinate area of i'th partial area ($1 \leq i \leq n$) and j'th subordinate area of k'th partial area ($k \neq i$ and $1 \leq k \leq n$) outputting a same polarization state.

3. The optical system as claimed in claim 2, wherein the polarization patterns in j'th subordinate area of i'th partial area ($1 \leq i \leq n$) and j'th subordinate area of k'th partial area ($k \neq i$ and $1 \leq k \leq n$) are bar patterns in the same direction.

4. The optical system as claimed in claim 1, wherein each of the subordinate areas has one of a first thickness and a second thickness greater than the first thickness.

5. The optical system as claimed in claim 1, wherein the beam shaper is a diffractive optical element (DOE) or a holographic optical element (HOE).

6. The optical system as claimed in claim 1, wherein a thickness of each of the bar patterns is about 10 nm to 200 nm.

7. The optical system as claimed in claim 1, wherein the bar patterns are made of materials having a real refractive index between about 1.3 and 2.5, and an extinction coefficient between about 0 and 0.2.

8. The optical system as claimed in claim 1, wherein the material for the bar patterns is selected from the group consisting of SiN, SiON and photoresist.

9. The optical system as claimed in claim 1, further comprising:
a light delivery system for delivering the light beam generated from the light source to the target object.

10. The optical system as claimed in claim 1, wherein the polarization controller is on a surface of the beam shaper.

11. The optical system as claimed in claim 1, wherein the beam shaper and the polarization controller are separate elements.

12. The optical system as claimed in claim 11, wherein the beam shaper is disposed between the light source and the polarization controller or between the polarization controller and the target object.

13. A method for forming an optical system, comprising:
creating a beam shaper for splitting a light beam of a designated wavelength generated from a light source into at least one partial beam, the light beam being irradiated toward a target object, and the target object being a photomask having designated circuit patterns for the manufacture of a semiconductor device; and creating a polarizer for controlling the polarization states of the at least one partial beam, the polarizer including a plurality of a bar patterns arranged in a designated direction, a pitch between the plurality of a bar patterns being about 0.2 to 1.5 times the wavelength of the light beam, and a width of each bar pattern being about 0.2 to 0.8 times the pitch between the bar patterns, wherein creating the beam shaper includes:
preparing a transparent substrate having a natural number n of partial areas, in which each of the partial areas has a natural number m of subordinate areas, and
patterning the substrate to different thicknesses of the subordinate areas according to positions, thereby forming diffractive optical patterns for outputting the split light beam with a designated profile.

14. The method as claimed in claim 13, wherein creating the polarizer comprises:
forming polarization patterns providing the same polarization state in the same subordinate areas of each of the partial areas of the beam shaper.

15. The method as claimed in claim 13, wherein creating the polarizer comprises:
forming polarization patterns in a designated direction on a surface of the beam shaper.

16. The method as claimed in claim 13, wherein creating the polarizer comprises:
forming polarization patterns in a designated direction on a surface separated from the beam shaper.

17. A method for manufacturing a semiconductor device, the method comprising:
generating a light beam of a designated wavelength, the light beam being irradiated toward a target object, and the target object being a photomask having designated circuit patterns for the manufacture of a semiconductor device;
splitting the light beam into a plurality of partial beams having different polarization states from each other by using a beam shaper and a polarization controller; and
exposing a photoresist layer coated on a semiconductor substrate using the plurality of partial light beams having the different polarization states from each other, wherein:

the beam shaper includes a natural number n of partial areas, and each of the partial areas of the beam shaper includes a natural number m of subordinate areas, the subordinate areas having different thicknesses in accordance with their position in the beam shaper; and the polarization controller includes a plurality of bar patterns arranged in a designated direction, a pitch between the plurality of bar patterns is about 0.2 to 1.5 times the wavelength of the light beam, and a width of each bar pattern is about 0.2 to 0.8 times the pitch between the bar patterns.

18. The method as claimed in claim 17, wherein the subordinate areas have different thickness in accordance with their position in the beam shaper in order to split the light beam into the plurality of partial beams.

* * * * *